Figure 1:
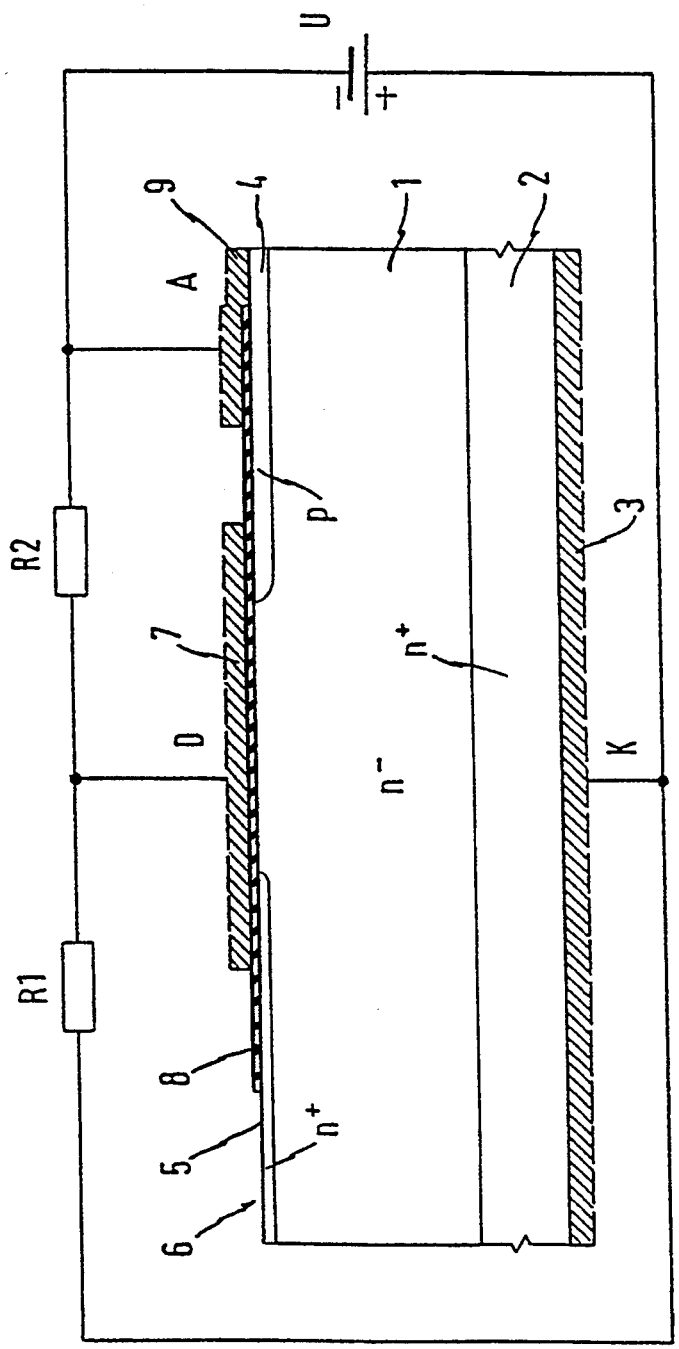

United States Patent [19]

Michel et al.

[11] Patent Number: 5,449,949
[45] Date of Patent: Sep. 12, 1995

[54] MONOLITHIC INTEGRATED SEMICONDUCTOR DEVICE

[75] Inventors: Hartmut Michel; Peter Flohrs, both of Reutlingen; Alfred Goerlach, Kusterdingen, all of Germany

[73] Assignee: Robert Bosch GmbH, Stuttgart, Germany

[21] Appl. No.: 74,874

[22] PCT Filed: Nov. 19, 1991

[86] PCT No.: PCT/DE91/00909

§ 371 Date: Jun. 11, 1993

§ 102(e) Date: Jun. 11, 1993

[87] PCT Pub. No.: WO92/10855

PCT Pub. Date: Jun. 25, 1992

[30] Foreign Application Priority Data

Dec. 12, 1990 [DE] Germany .............. 40 39 662.2

[51] Int. Cl.⁶ ..................................... H01L 29/861
[52] U.S. Cl. ..................................... 257/567; 257/572; 257/491; 257/488
[58] Field of Search ............... 257/567, 572, 491, 488, 257/577

[56] References Cited

U.S. PATENT DOCUMENTS 4,618,875 10/1986 Flohrs ..................................... 357/46
4,695,867 9/1987 Flohrs et al. .......................... 257/572
4,916,494 4/1990 Flohrs et al. .......................... 257/603

FOREIGN PATENT DOCUMENTS

WO83/02528 7/1983 WIPO.

OTHER PUBLICATIONS

C. G. Jambotkar, "Spaced Field Plate for Increasing Planar Junction Breakdown Voltage," IBM Technical Disclosure Bulletin, vol. 19, No. 2, pp. 478–479, Jul. 1976, Armonk, N.Y.

Primary Examiner—Robert P. Limanek
Assistant Examiner—David B. Haroy
Attorney, Agent, or Firm—Frishauf, Holtz, Goodman & Woodward

[57] ABSTRACT

A monolithic integrated semiconductor is proposed, in which on the main surface of a monolithically integrated n-p-n transistor or p-n-p transistor, a cover electrode (D1) is mounted for internal voltage limitation, covering only a single junction region between a highly doped zone (5) and the weakly doped substrate (1). An adjacent highly doped zone (4) is not covered by the cover electrode (D1). By connecting the metal cover electrode (D1) to the pickup (12) for a voltage divider (R1, R2), a breakdown voltage can be adjusted that is higher than the sum of the depletion breakdown voltage and the enhancement breakdown voltage.

12 Claims, 8 Drawing Sheets

MONOLITHIC INTEGRATED SEMICONDUCTOR DEVICE

BACKGROUND OF THE INVENTION

The invention relates to a monolithic integrated semiconductor device.

Semiconductor devices are known that, in order to limit the breakdown voltage of transistors, especially Darlington transistors, have an oxide-separated metal cover electrode above the space charge region that is connected by means of a voltage divider to a certain potential between the base and the collector. The breakdown voltage is determined substantially by the voltage potential of the cover electrode and by the thickness of the oxide.

U.S. Pat. No. 4,618,875, FLOHRS, discloses this kind of Darlington transistor circuit, in which the cover electrode is formed on the surface of the substrate and extends across two spaced-apart zones of opposite doping. The maximum attainable breakdown voltage is equivalent to the voltage value resulting from the sum of the enhancement breakdown voltage and depletion breakdown voltage. However, it must be taken into account that the thermal oxides typically used in planar processes cannot be made arbitrarily thick, so that the maximum attainable voltage with such a device is limited.

ADVANTAGES OF THE INVENTION

A monolithic integrated semiconductor device has the advantage over the prior art that the breakdown voltages are dependent only on the depletion breakdown voltage and on the divider ratio of the voltage divider, which is connected by its pickup to the cover electrode and determines the voltage potential thereof. In an n-p-n transistor, the cover electrode no longer completely covers the collector zone but instead covers only a junction region of the low-n-doped collector zone and the peripheral region of an adjacent highly n-doped zone. In an n-p-n transistor, the cover electrode does not reach as far as the p-doped base zone. Conversely, in a p-n-p transistor, it is precisely the junction region of the base zone that is covered by the cover electrode, which in this case does not extend as far as the spaced-apart p-doped zone.

In a further feature of the invention, the p-n junction between the high-impedance collector zone and the p-doped base zone, in a semiconductor device formed as a transistor, can also be passivated by means of a second cover electrode. The second cover electrode is identical to the base metallizing coating of the transistor. However, it is also possible to connect this second cover electrode to emitter potential; in any case, it must be assured that the two cover electrodes are electrically separated, so that no enhancement breakdown can occur. In this version as well, the maximum attainable breakdown voltage is dependent only on the depletion breakdown voltage and on the voltage divider ratio of the voltage divider to whose pickup the first cover electrode, remote from the base zone, is connected.

The voltage potential for the cover electrode is preferably adjusted by means of a monolithically integrated voltage divider. The embodiment of such a voltage divider is known from both European Patent 179 099 and U.S. Pat. No. 4,695,867.

To achieve a temperature compensation of the breakdown voltage, the resistors forming the voltage divider may be formed of unequally highly doped silicon.

The divider resistors can be integrated very easily in the form of strip-shaped zones that except for connection points are covered with a passivation layer. At the connection points, the necessary bonding, such as to the pickup of the voltage divider, can be done by applying a metal layer.

Advantageous further features of the invention are defined by the dependent claims.

DRAWINGS

Figure 2:
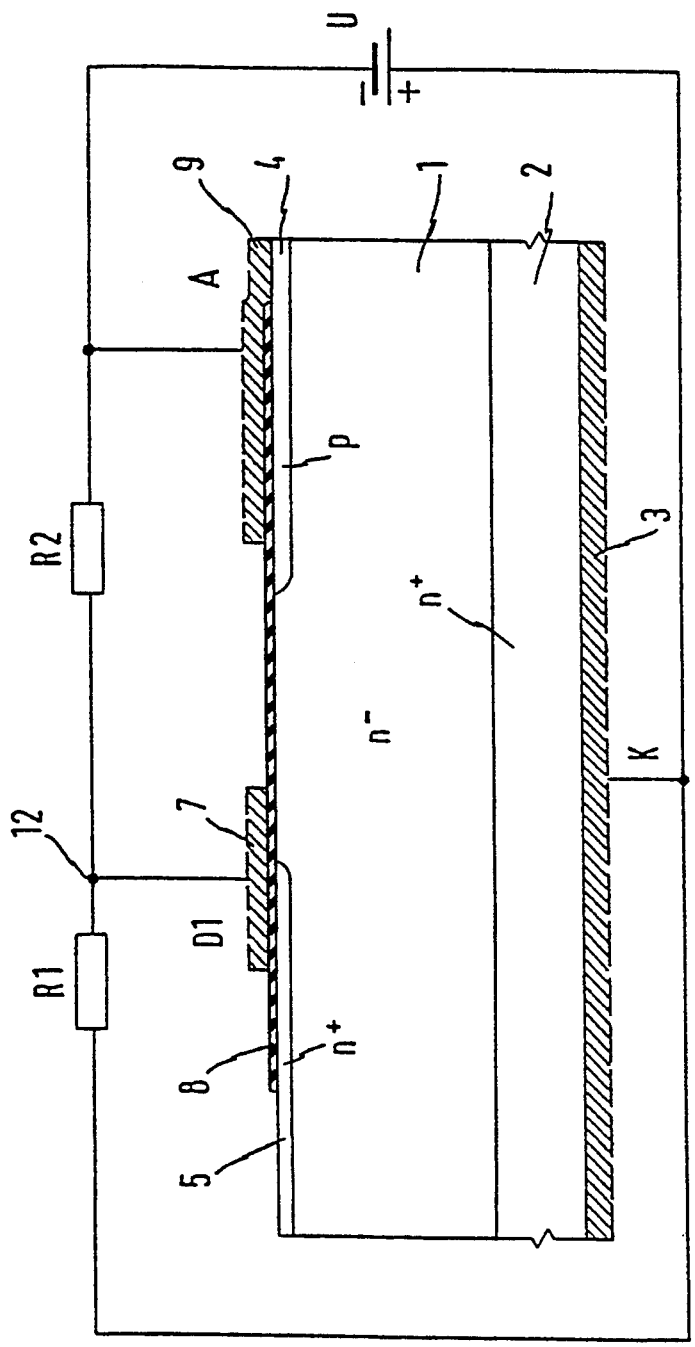
Figure 3:
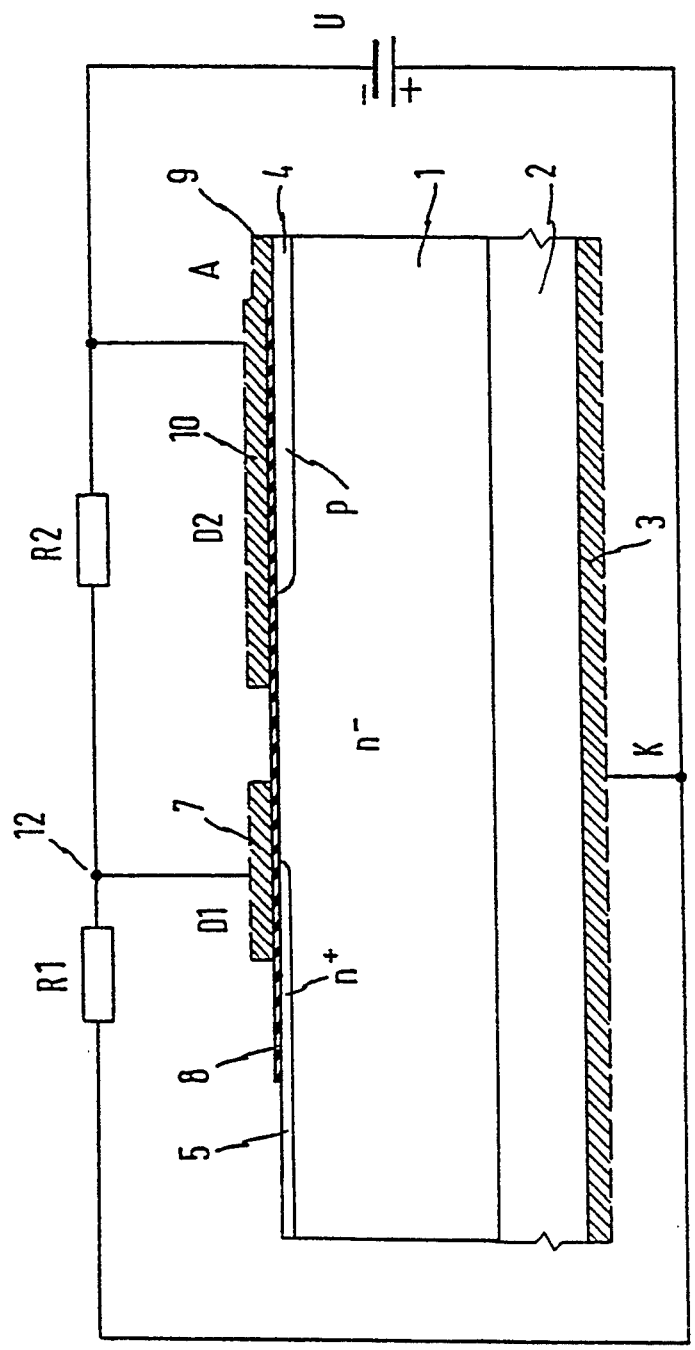
Figure 4:
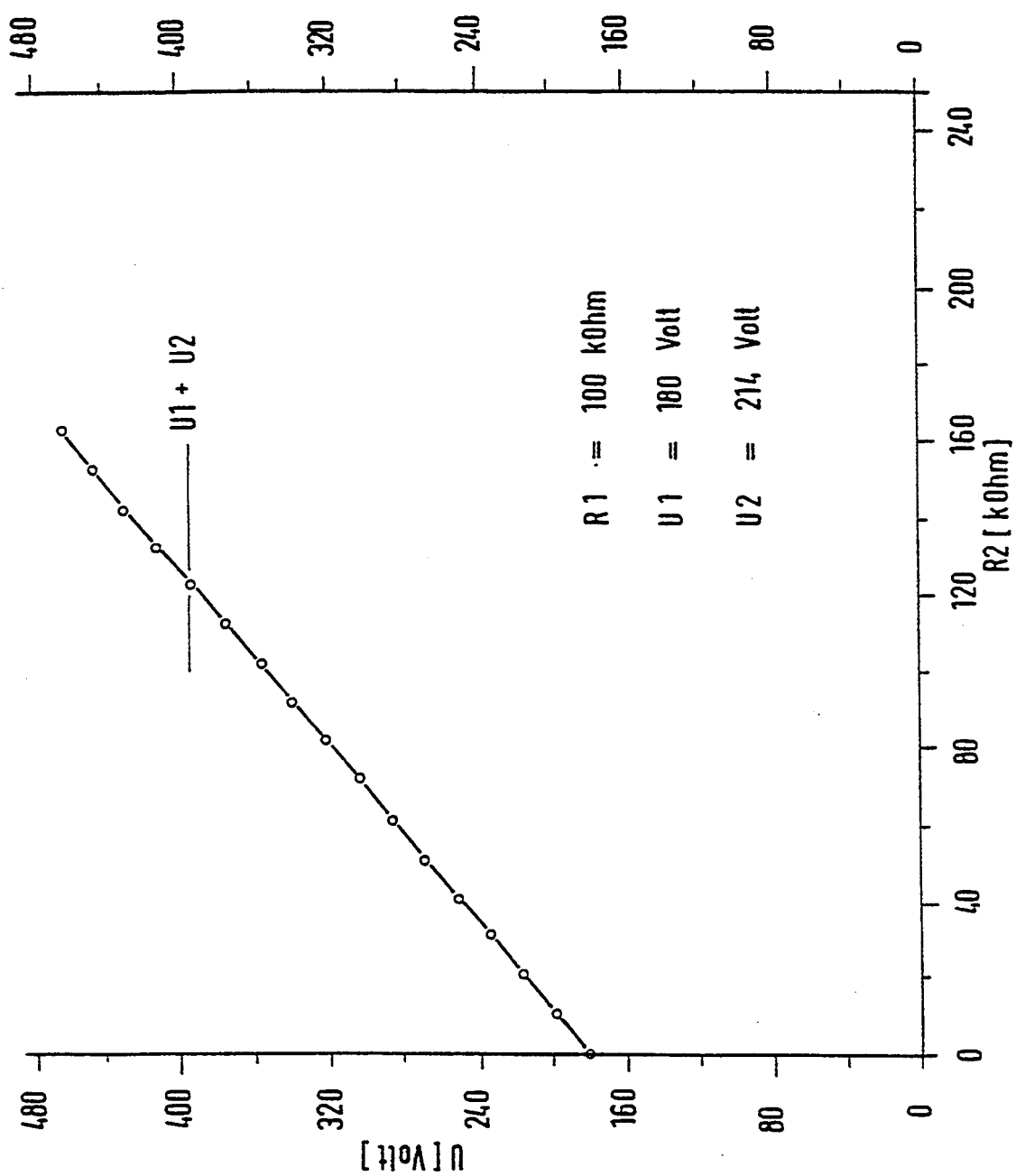
Figure 5:
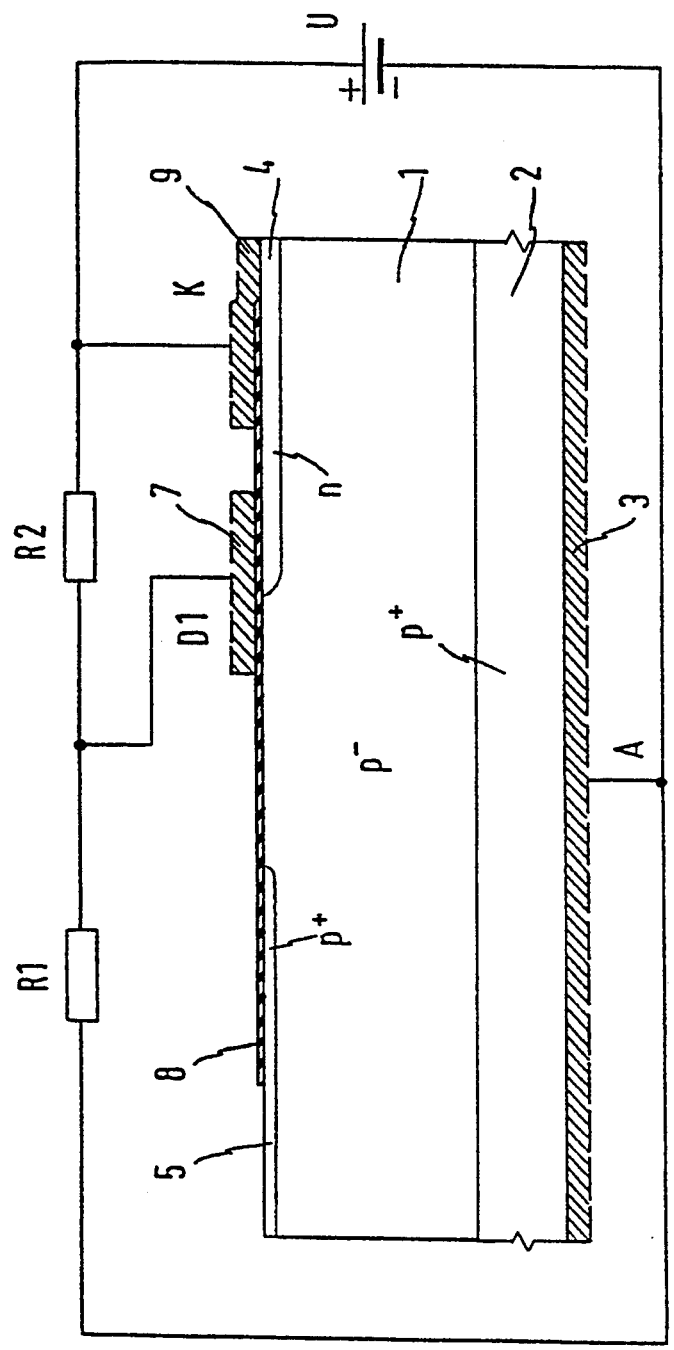

The invention will be described in further detail below in terms of one conventional semiconductor device, and additional versions according to the invention. Shown are:

FIG. 1, a conventional semiconductor device;

FIG. 2, a first device according to the invention, having a cover electrode that covers an n—n junction;

FIG. 3, a device according to the invention with an additional base cover electrode, in an n-p-n transistor;

FIG. 4, the dependency of the breakdown voltage of a device according to the invention on the voltage divider ratio;

FIG. 5, a semiconductor device according to the invention that is embodied as a p-n-p transistor.

Figure 6:
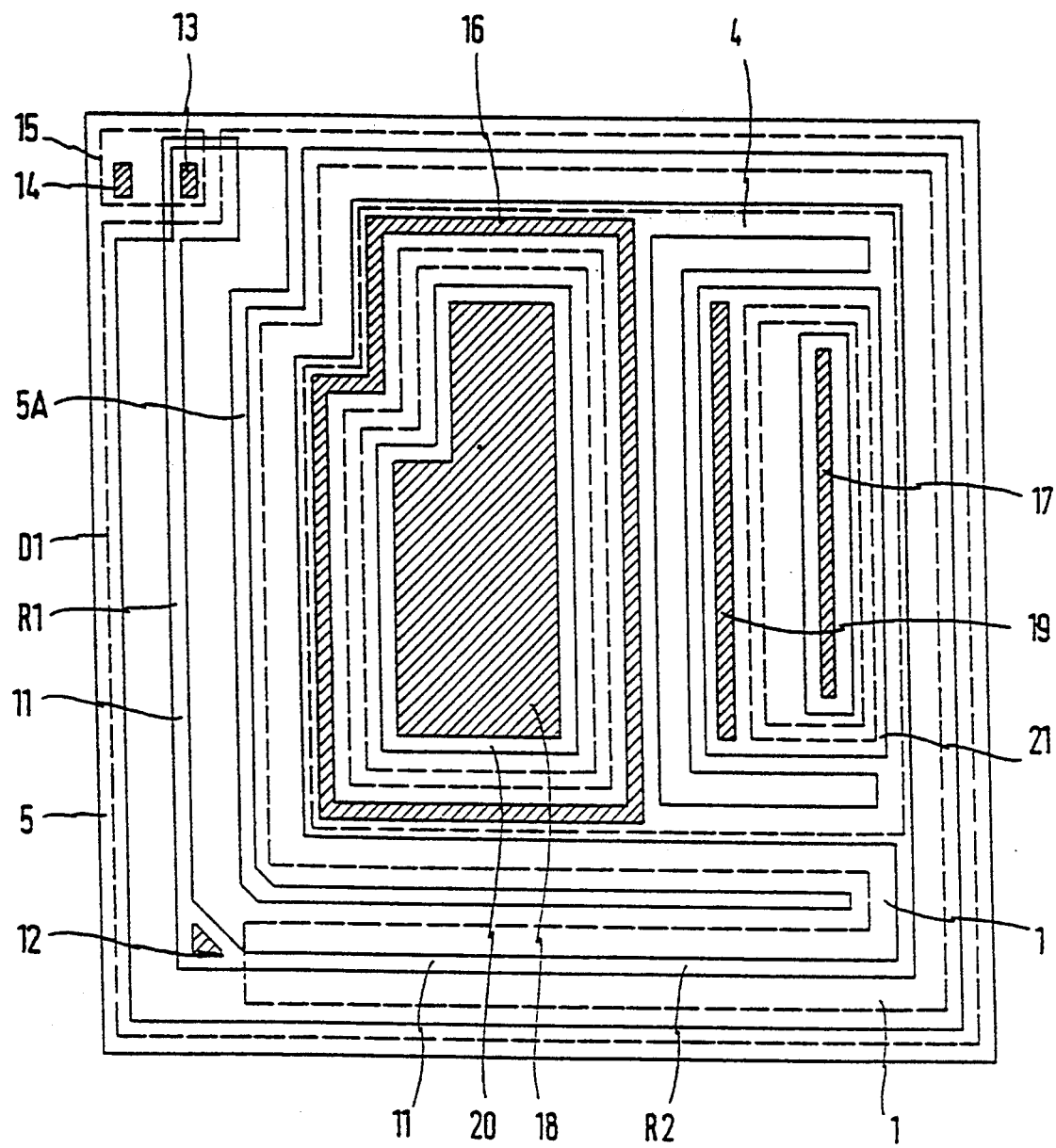
Figure 7:
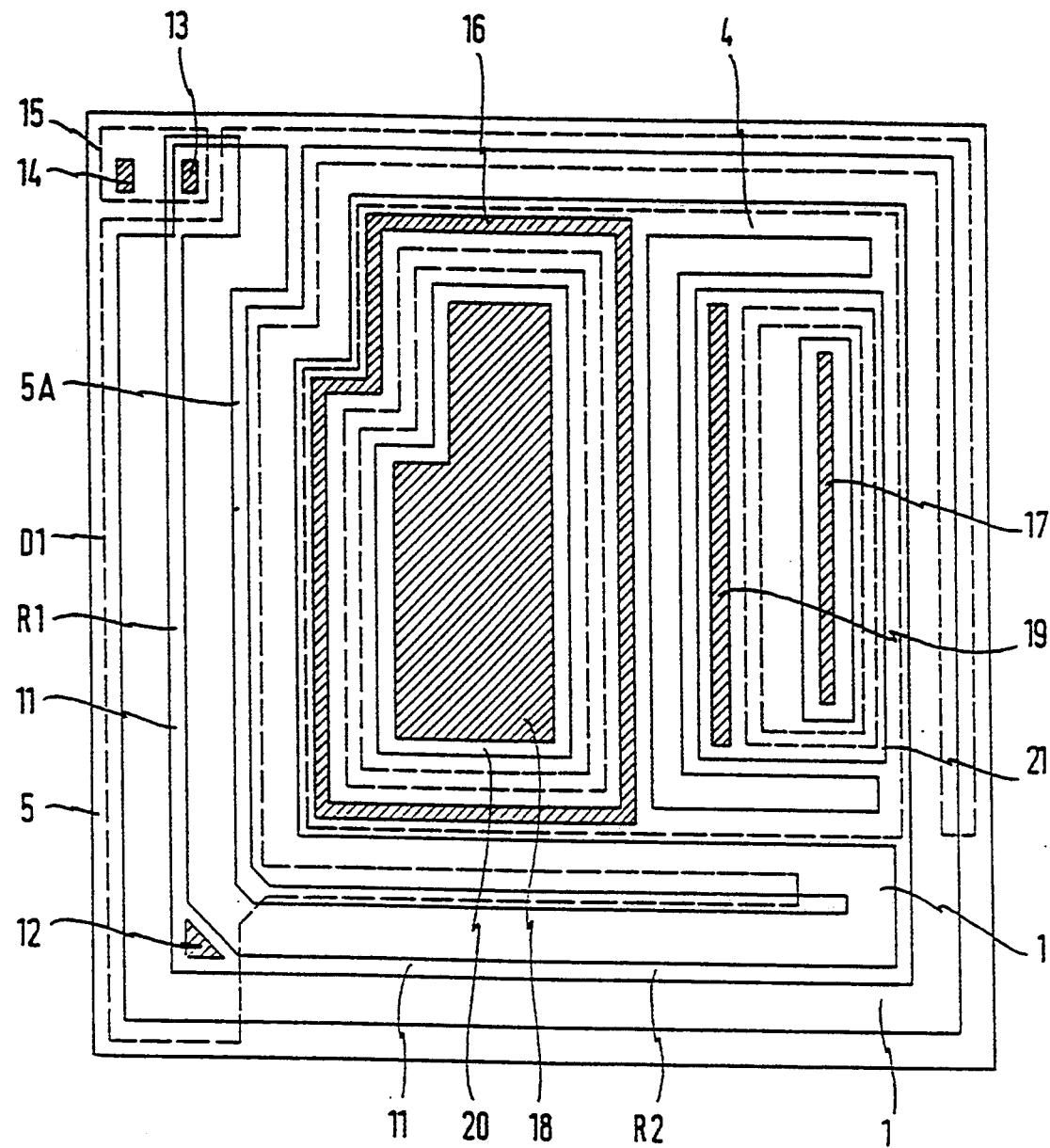
Figure 8:
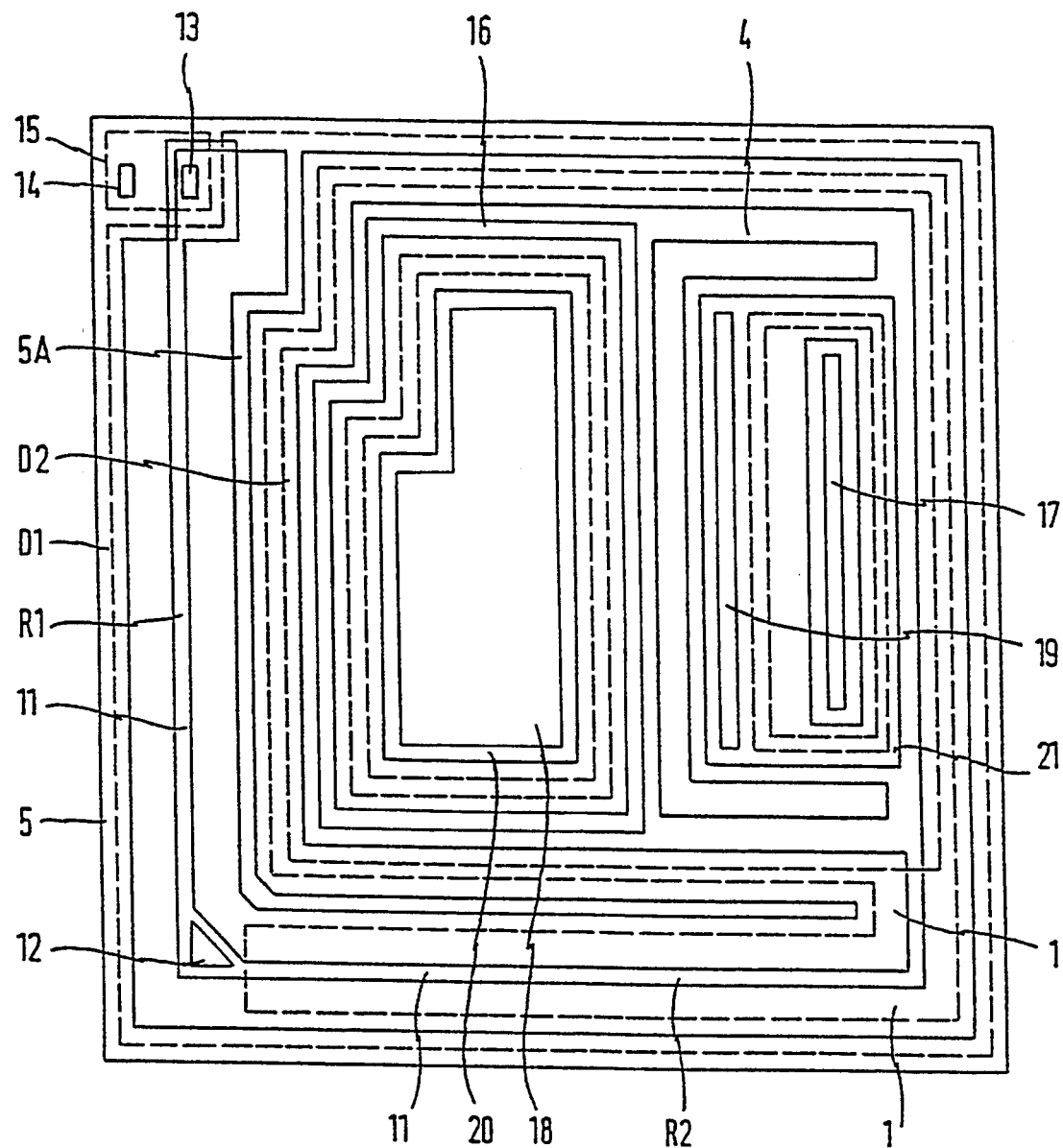

FIG. 6, the plan view on a semiconductor device according to the invention with a cover electrode and an integrated voltage divider, in which the part of the voltage divider toward the base is not located under cover electrode metal;

FIG. 7, the plan view on a semiconductor device according to the invention, in which a lower current dependency of the breakdown voltage is attained, and FIG. 8, the plan view on a semiconductor device according to the invention having an additional base cover electrode, in which the part of the voltage divider toward the base is not located under metal.

FIG. 1 shows a device made by planar technology, of the kind described in German Patent 32 27 536 and U.S. Pat. No. 4,618,875, FLOHRS. The starting material for production is silicon, which is weakly doped ($n^-$) in the upper zone 1 and highly ($n^+$) doped on the underside 2. The underside is bonded with metal 3 and marked K. The p and $n^+$ zones 4, 5 on the main surface 6 are produced by photolithography, doping and diffusion in a known way. The p zone 4 serves as a transistor base and is marked A. For the sake of simplicity, the $n^+$-doped emitter zone that in a bipolar transistor is put in place in the base zone 4 i not shown. The $n^+$ zone 5 with the protrusion 5A (see FIGS. 6–8) can be diffused in simultaneously with the emitter doping. It limits the space charge zone, spreading out in the $n^-$ zone, to zones under a cover electrode D formed by a metallizing coating 7, if a blocking voltage U is applied between A and K. The cover electrode D is electrically separated from the zones 1, 4 and 5 by means of oxide 8. The base zone 4 is bonded to metal 9. The cover electrode D is connected between A and K to a voltage divider formed by resistors R1 and R2, which is also monolithically integratable. The attainable breakdown voltages attainable between A and K if R1 or R2=0 are U2 and U1, respectively; U2 is the enhancement breakdown voltage and U1 the depletion breakdown voltage of the MOS structure formed by the cover electrode D, the oxide 8 lying beneath it, and the silicon.

The maximum attainable breakdown voltage is U1+U2, if the condition R1:R2=U1:U2 is met. Since the thermal oxides that are typically used in planar processes cannot be made arbitrarily thick, the maximum attainable voltage with such a device is limited.

In FIG. 2, a device according to the invention is shown, with a cover electrode D1 that covers the high-impedance, weakly doped (n−) collector zone 1 only in the region of a highly doped (n+) zone 5. The cover electrode D1 accordingly covers the n+ n− junction region and is located at a pronounced distance from the P zone 4, which serves as the base zone of an n-p-n transistor. For the sake of simplicity, the emitter doping in the region of the base zone 4 is not shown. The embodiment of the emitter dopings may be learned from U.S. Pat. No. 4,618,875, mentioned above.

The cover electrode D1 is connected by the pickup 12 to the voltage divider formed by the resistors R1 and R2. The voltage divider divides the supply voltage U, located between the connection points A and K, in accordance with its divider ratio. If a blocking voltage is applied between A and K, then the attainable breakdown voltage between A and K is U1 if R2=0; U1 is then identical to the depletion breakdown voltage when the cover electrode D of FIG. 1 is used. The breakdown voltage U between A and K is the depletion breakdown voltage, transformed upward by the voltage divider formed by the resistors R1 and R2. The voltage obtained is:

$$U = U1*(1 + R2/R1) \quad (1)$$

The maximum attainable breakdown voltage U between A and K is influenced more by the enhancement breakdown voltage U2. The upper limit of the breakdown voltage U is limited only by the blocking capability of the p-n junction 1, 4, or by the collector-emitter breakdown voltage $U_{CEO}$ given an open base of the n-p-n transistor.

FIG. 3 shows a version in which the p-n− junction between the high-impedance collector zone 1 and the p-doped base zone 4 is passivated by means of a second metal cover electrode D2. The two cover electrodes D1 and D2 do not touch one another so that they can be said to form a split cover electrode. The metallizing coating 10 that forms the cover electrode D2 is identical to the base metallizing coating of the transistor. However, it is also possible to connect the metallizing coating 10 to emitter potential, although then it must be assured that the metallizing coatings 7 and 10 are electrically separated. In this version as well, no enhancement breakdown can occur; hence the maximum attainable breakdown voltage U is determined only by the depletion breakdown voltage U1 and the voltage divider ratio, in accordance with the above equation (1).

In the event that the two cover electrodes D1 and D2 are electrically connected with one another and are connected to the voltage divider R1, R2, a breakdown performance is obtained that is completely identical to the conventional cover electrode D (FIG. 1); in particular, the maximum attainable breakdown voltage then is again the sum of the enhancement breakdown voltage and the depletion breakdown voltage (U1+U2).

FIG. 4 shows the dependency of a breakdown voltage of a semiconductor device with a split cover electrode (D1 and D2) on the voltage divider ratio. Here the depletion breakdown voltage U1 is 180 V and the enhancement breakdown voltage U2 is 214 V. The resistance of resistor R1 is 100 kΩ. The breakdown voltage U between points A and K is plotted as a function of the resistance of the voltage divider resistor R2. The breakdown voltage U has the course described by equation (1). If R2>125 kΩ, breakdown voltages are attained that are greater than the sum of the depletion breakdown voltage and the enhancement breakdown voltage. The example shown assumes a device in accordance with FIG. 2, in which the resistors R1, R2 are connected externally.

The present invention is not limited to n-p-n transistors; it can also be employed with p-n-p transistors, as can be seen from FIG. 5. There the high-impedance collector zone 1 is weakly p-doped, and the zone 4 of the opposite conductivity type is n-doped and again forms the base zone of a transistor. Spaced apart from that zone 4 on the main surface 6 is a second, highly doped zone 5 with a protrusion 5A (see FIGS. 6–8) of the same conductivity type as the substrate forming the collector zone 1. However, the p-doped second zone 5 is highly doped, as is the underside 2 of the substrate. In the view of FIG. 5 again, the emitter zone is not shown for the sake of simplicity.

In this version, the cover electrode D1 is located above the collector-base junction 1, 4. The polarity of the blocking voltage U is opposite that of the versions described above. Analogously to FIG. 3, in the version of FIG. 5 as well the junction from the collector zone 1 to the highly doped zone 5 may be covered by metal located at collector potential. If a blocking voltage is applied between A and K, the enhancement breakdown voltage U2, which is stable in the case of a p-n-p transistor, is transformed upward by the voltage divider. Thus the breakdown voltage U between A and K in p-n-p transistors is obtained from the following equation:

$$U = U2*(1 + R1/R2) \quad (2)$$

In the monolithic integration of the voltage divider, which may also be in a calibratable version, no regions in which an enhancement breakdown occurs can be allowed.

In conjunction with FIGS. 6–8, it is shown how an internal voltage limitation can be achieved in a planar n-p-n Darlington transistor with an integrated voltage divider. All the metallizing edges are shown as broken lines.

FIG. 6, in a plan view, shows an example analogous to FIG. 2 that lacks a cover electrode D2. The base metallizing coating of the end stage transistor is located entirely inside the p-doped base zone 4. A voltage divider 11 forms an elongated p-conductive zone diffused in from the main surface. The collector-side part R1 of the voltage divider 11 is covered by the passivation layer (8 in FIG. 2) and by the cover electrode D1 extending above it. At a certain point 12, the passivation layer 8 is removed below the cover electrode D1. The thus-formed contact hole 12 connects the cover electrode D1 at one point to the voltage divider 11. A contact hole 13 is likewise opened on the collector-side end of the voltage divider. In addition, the highly doped collector layer 5, acting as a stop layer, can be bonded at one point 14. A metallizing bridge 15 establishes an electrical connection between the collector layer and the voltage divider end.

The base-side end of the voltage divider opens directly into the p-doped base zone 4 of the end stage of the Darlington transistor. The base-side part R2 of the voltage divider is not located under the cover electrode metal D1, in order to avoid the enhancement breakdown. Also visible are the bonding faces for the end stage base 16, for the driver base 17, for the end stage emitter 18, and for the driver emitter 19. The end stage emitter itself is marked 20 and the driver emitter is marked 21. For the sake of simplicity, not all the details of the Darlington transistor are shown, such as the leak resistance of the end stage transistor, the inverse diode, and so forth. Since in the device of FIG. 6 the base-side end of the voltage divider (R2) also loses its blocking capability upon reaching the breakdown voltage, the characteristic breakdown curve becomes current-dependent. To avert this, the oxide is made thicker above the high-impedance collector zone 1 in the area surrounding the resistor R2. As a result, the depletion breakdown voltage in this region is increased, so that the voltage divider resistor R2 preserves its blocking capability.

The voltage divider resistor may also be put in place by means of one or two separate p-doping steps. By this means, high resistances or various temperature coefficients can be attained. Moreover, the voltage divider resistor can be made calibratable.

Another simple possibility of obtaining characteristic breakdown curves that are independent of current, without employing the provision of lessening the oxide thickness, is shown in the exemplary embodiment of FIG. 7. There the D1 metallizing coating is omitted in the regions of the voltage divider resistor R2. Thus no depletion breakdown occurs in this region, and the resistor R2 does not lose its blocking capability.

FIG. 8 shows an example with an additional cover electrode D2 (split cover electrode). The base-collector junction (4, 1) is then covered virtually completely by oxide-separated metal.

We claim:

1. A monolithic integrated semiconductor device having at least one p-n junction, comprising:
   an n-doped substrate having a main surface, an underside and one specific conductivity type,
   a metallizing coating formed on the underside of the substrate and having a potential value,
   a p-doped first zone of opposite conductivity type diffused into the main surface of the substrate and having a potential value,
   a highly n-doped second zone of the same conductivity type as the substrate, said second zone being diffused into the main surface of the substrate spaced apart from the first zone,
   at least one passivation layer partially covering the main surface of the substrate, and
   at least one metal cover electrode applied on said at least one passivation layer and connected to a voltage potential having a value between the potential value of the first zone and the potential value of the metallizing coating formed on the underside of the substrate, said at least one metal cover electrode including a first cover electrode spaced apart from the p-doped first zone so as to cover the n-doped second zone and a portion of the main surface of the substrate adjoining the second zone without covering the p-doped first zone.

2. The semiconductor device of claim 1, wherein said at least one metal cover electrode further comprises:
   a base metallizing coating forming a second cover electrode, which covers a peripheral region between the first zone and an adjoining portion of the substrate.

3. The semiconductor device of claim 1, wherein the first cover electrode is connected to a pickup of a monolithically integrated voltage divider.

4. The semiconductor device of claim 3, wherein said voltage divider includes first and second resistors formed of differently doped silicon in order to provide temperature compensation for a breakdown voltage of said semiconductor device.

5. The semiconductor device of claim 3, wherein said voltage divider includes first and second resistors formed by a striplike zone, which is diffused into the substrate and touches the first zone at one end thereof and the second zone at another end thereof and is covered by the at least one passivation layer except for the pickup (12) of the divider.

6. The semiconductor device of claim 4, wherein said first cover electrode includes a metallizing coating,
   the first resistor is located at one end of a potential of the metallizing coating formed on the underside of the substrate and is covered by the metallizing coating of the first cover electrode, and
   the second resistor is at most partially covered by said metallizing coating of the first cover electrode.

7. The semiconductor device of claim 6, wherein the metallizing coating forming the first cover electrode completely covers junction regions formed on the main surface between the second zone and the substrate.

8. The semiconductor device of claim 6, wherein junction regions located on the main surface between the second zone and the substrate are covered by the metallizing coating forming the first cover electrode, except for points where said regions are facing the second resistor.

9. A monolithic integrated semiconductor device having at least one p-n junction, comprising:
   a p-doped substrate having a main surface, an underside and one specific conductivity type,
   a metallizing coating formed on the underside of the substrate and having a potential value,
   an n-doped first zone of opposite conductivity type diffused into the main surface of the substrate and having a potential value,
   a highly p-doped second zone of the same conductivity type as the substrate, said second zone being diffused into the main surface of the substrate spaced apart from the first zone,
   at least one passivation layer partially covering the main surface of the substrate, and
   at least one metal cover electrode applied on said at least one passivation layer and connected to a voltage potential having a value between the potential value of the first zone and the potential value of the metallizing coating formed on the underside of the substrate, said at least one metal cover electrode including a first cover electrode spaced apart from the p-doped second zone so as to cover both the n-doped first zone and a portion of the main surface of the substrate adjoining the first zone, without covering the p-doped second zone.

10. The semiconductor device of claim 9, wherein the first cover electrode is connected to a pickup of a monolithically integrated voltage divider.

11. The semiconductor device of claim 10, wherein said voltage divider includes first and second resistors formed of differently doped silicon in order to provide temperature compensation for a breakdown voltage of said semiconductor device.

12. The semiconductor device of claim 10, wherein said voltage divider includes first and second resistors formed by a striplike zone, which is diffused into the substrate and touches the first zone at one end thereof and the second zone at another end thereof and is covered by the at least one passivation layer except for the pickup of the divider.

* * * * *